United States Patent [19]

Frye et al.

[11] 4,161,029

[45] Jul. 10, 1979

[54] AUTOMATIC TRANSIENT RESPONSE ANALYZER SYSTEM

[76] Inventors: George J. Frye, 12175 SW. Douglas St., Portland, Oreg. 97225; Leonardus J. Geerling, Rte. 2, Box 124D, Hillsboro, Oreg. 97123

[21] Appl. No.: 834,799

[22] Filed: Sep. 19, 1977

[51] Int. Cl.² .......................................... G01R 15/12
[52] U.S. Cl. ................................ 364/579; 324/73 R
[58] Field of Search ................... 364/579, 482, 487; 324/57 R, 57 PS, 57 SS, 73 R, 73 AT; 235/302

[56] References Cited

U.S. PATENT DOCUMENTS

| 3,393,301 | 7/1968 | Valstar | 364/579 |
| 3,790,767 | 2/1974 | Alexander | 364/579 |
| 3,976,940 | 8/1976 | Chau et al. | 324/73 R |
| 4,044,244 | 8/1977 | Foreman et al. | 235/302 |
| 4,058,767 | 11/1977 | Muehldorf et al. | 324/73 R |
| 4,070,565 | 1/1978 | Borrelli | 235/302 |

Primary Examiner—Charles E. Atkinson
Attorney, Agent, or Firm—Adrian J. LaRue

[57] ABSTRACT

An automatic transient response analyzer system takes advantage of a digital computer and circuitry controlled thereby to measure the time that a device under test takes to come within specified limits of a final output when driven by a signal which stepwise increases or decreases in amplitude by a known amount.

5 Claims, 2 Drawing Figures

AUTOMATIC TRANSIENT RESPONSE ANALYZER SYSTEM

BACKGROUND OF THE INVENTION

Amplifying systems, especially those incorporating automatic volume or automatic gain control circuits, exhibit finite response times when driven by a stepwise increasing or decreasing signal.

Typically this form of amplifier has a settling time when driven by a transient signal. During such settling time, the output signal can undergo one or more oscillations before finally achieving a stable value.

Traditionally the transient behavior has been observed using conventional oscillographic techniques for display of the output envelope while the input drive signal is derived from a gated signal generator which may also furnish trigger signals to the oscillographic sweep circuity.

Measurement of the transient response or settling time to within preset limits above and below the final amplitude of the envelope has thus been done by analog means using the calibrated sweep and a marked graticule display means of the oscillographic device.

It has been difficult to automate the measurement settling time because of the multiple complexities of the drive signal, the oscillographic sensitivity control and sweep control and unknown transient behavior of the device under test to the test stimulus.

SUMMARY OF THE INVENTION

The present invention relates to transient response analyzer systems and more particularly to automatic transient response analyzer systems.

A digital computer controlled analyzer system is disclosed in U.S. Pat. No. 4,065,647. Several of the circuits disclosed in this system are utilized in the present invention. These circuits are a signal generator circuit whose frequency and amplitude are controlled by the computer. A prescaler amplifier and A to D converter circuit combined with a signal amplitude standardizer circuit are also under control of the digital computer. Additional circuitry including detector means following the signal amplitude standardizer circuit, plus and minus comparator means, logic gate means and clock driven counter and latch means, also under control of the digital computer, enable the previously difficult measurement to be made with relative ease.

It is an object of the present invention to provide an automatic circuit means for measuring the settling time of amplifier circuit means.

Another object of the present invention is the provision of the use of a digital computer in an automatic transient response analyzer system.

A further object of the present invention is the use of automatic signal amplitude standardizer means in the measurement of the settling means in the measurement of the settling time of an amplifier means.

An additional object of the present invention is the use of digital logic means to replace conventional analog means to simplify the measurement of transient response of an amplifier means.

The foregoing and other objects of the present invention will become apparent to those skilled in the art upon reading the following description of the invention in conjunction with the accompanyng drawing illustrating a preferred embodiment of the invention. It is to be understood however that changes may be made from the exact details that have been shown and described without departing from the principles of the invention.

DETAILED DESCRIPTION OF THE INVENTION

Figure 1:
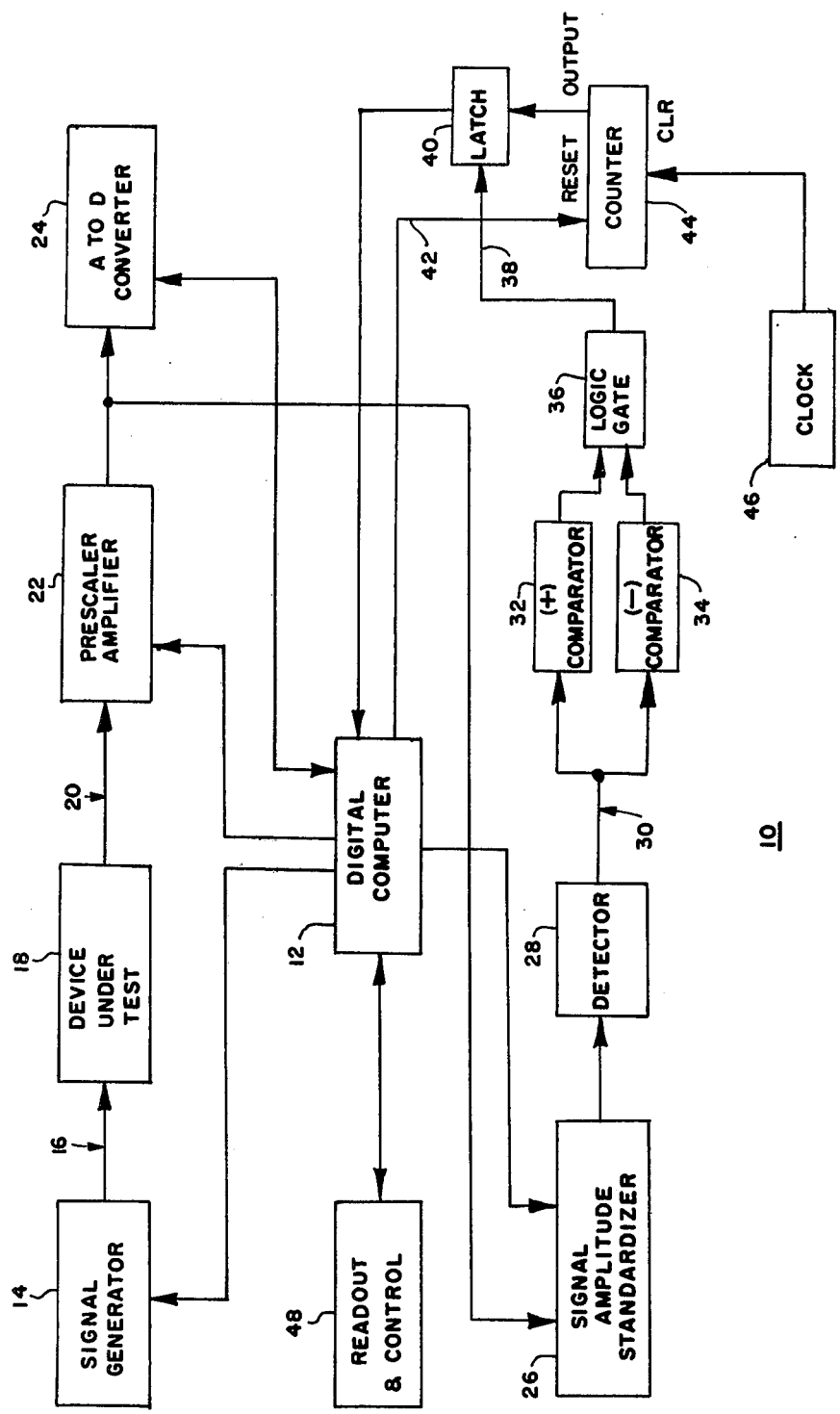
FIG. 1 is a block diagram of the automatic transient response analyzer system.

Turning now to the drawings, there is shown in FIG. 1 an automatic transient response analyzer system 10 which uses a conventional digital computer 12 complete with its built in program such as for example a type 8080 microprocessor and its attendant memory and interface semiconductor devices. This digital computer 12 directs the automatic transient analysis process described hereinafter.

Figure 2:
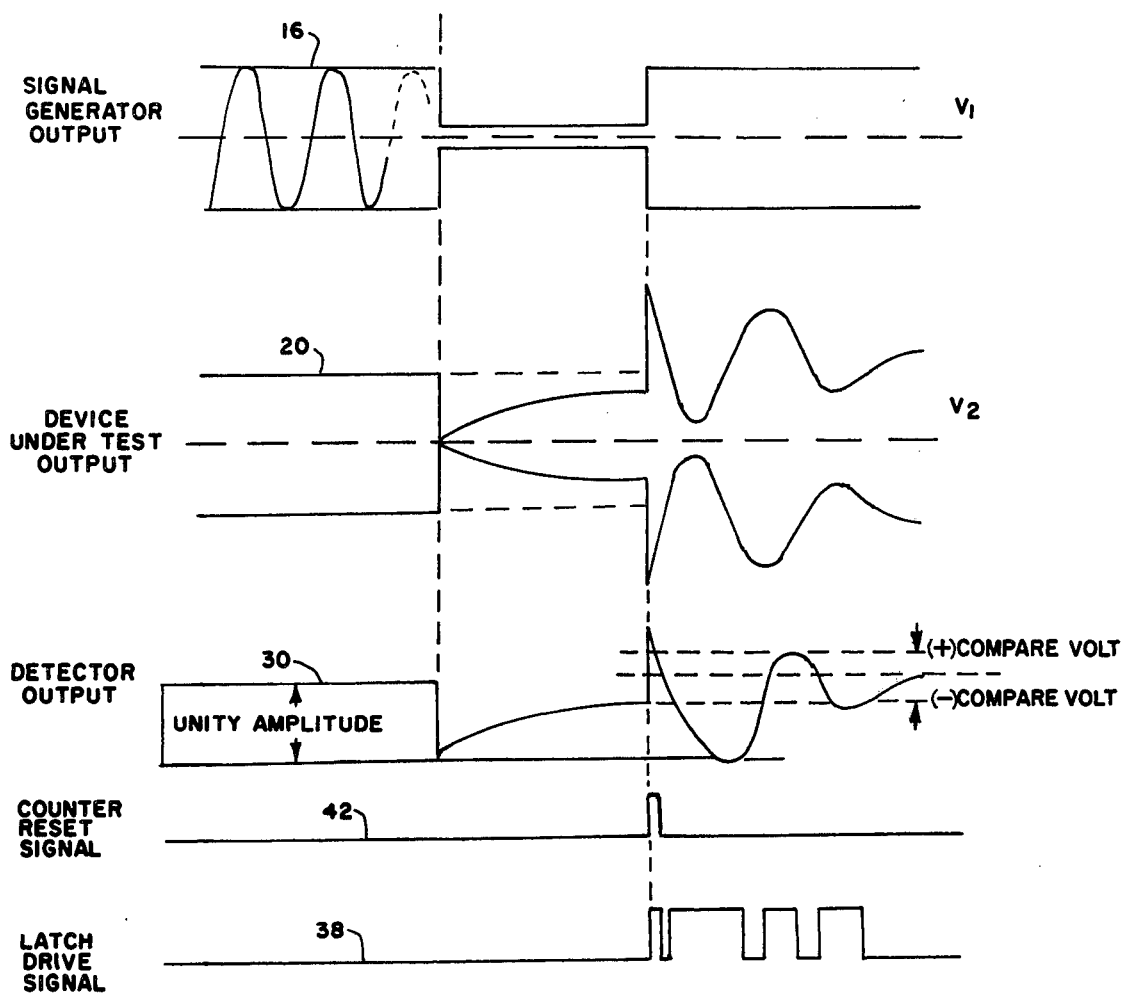
FIG. 2 is a representation of the waveforms of the various signals present in the circuits of FIG. 1.

A programmable signal generator 14 of conventional construction and under control of digital computer 12 generates sinusoidal signal 16 whose envelope is shown in FIG. 2 which is held at a predetermined amplitude for an extended period of time allowing the output signal 20 from device under test 18, such as for example an automatic gain control amplifier, to reach equilibrium. The envelope of output signal 20 is shown in FIG. 2.

Prescaler amplifier 22 and A to D converter 24 are under control of digital computer 12 and they provide information as to the absolute amplitude of signal 20. Prescaler amplifier 22 is completely disclosed in U.S. patent application Ser. No. 834,798, filed Sept. 19, 1977 whereas A to D converter 24 is of conventional design. The absolute amplitude information is used by signal amplitude standardizer 26 to develop an amplified version of the signal 20 such that this signal is of a constant and known value. Signal amplitude standardizer 26 is disclosed in U.S. patent application Ser. No. 706,640, filed July 19, 1976, now U.S. Pat. No. 4,065,647. When the amplified version of signal 20 is detected by detector 28 of conventional design, a unity amplitude DC signal 30 is derived therefrom which is shown in FIG. 2. It should be emphasized that the unity amplitude is derived under equilibrium condition.

After equilibrium and standardization has been achieved, the signal generator 14 is made to reduce its output amplitude signal 16 by a selected amount. The device under test 18 produces an output signal 20 which is also reduced in value as is also the detected output 30 of detector 28. The output signal 16 of signal generator 14 is held low until equilibrium is achieved. Updating of the gain of prescaler amplifier 22 is not undertaken at this time.

At another selected time, signal generator 14 is commanded to suddenly increase its level to that which was previously held during the first described equilibrium state. The signal 20 from the device under test 18 now undergoes a transient behavior which may include envelope oscillations as is shown in FIG. 2. The detected output 30 of detector 28 naturally follows these envelope oscillations finally coming to rest again at an equilibrium value which is the same as that found in the first part of the measurement.

Plus comparator 32 and minus comparator 34 are now used to generate via logic gate 36 latching pulses 38 as shown in FIG. 2 which are used to drive latch 40. Comparators 32 and 34, gate 36 and latch 40 are conventional circuits. At the same time that signal generator 14 was made to increase its signal level a reset signal 42 of short duration was delivered to digital BCD counter 44 of conventional design such that counter 44 was set to zero. A crystal controlled clock 46 of conventional design then causes counter 44 to start producing increasing time related output counts. During the oscillations of detector signal 30, latch drive pulses 38 are delivered to latch 40 whenever this signal 30 either is greater than the voltage level of plus comparator 32 or lower than the voltage level of minus comparator 34. The last time that the detected signal 30 crosses into the region defined by plus comparator 32 and minus comparator 34 causes the count of counter 44 to be made present at the output of latch 40. The computer can at a later time read out this count which corresponds to the settling time of the device under test 18.

It can also be understood that the same process can be employed to determine the settling time of the device under test 18 when the drive amplitude signal is suddenly decreased in value rather than increased as in the case just described.

Readout and control means 48 is a TEKTRONIX 4006-1 computer terminal and it receives digital readout signals from digital computer 12 and delivers control signals thereto.

It can readily be descerned that an automatic transient response analyzer system has been disclosed to measure the time that a device under test takes to come within specified limits of a final output when driven by a signal which stepwise either increases or decreases in amplitude by a known amount. Although the invention has been explained with reference to a particular embodiment, it is to be understood that various adaptations and modifications may be made without departing from the appended claims.

The invention is claimed in accordance with the following:

1. Automatic transient response analyzer system comprising:

digital computer means signal generator means under control of said digital computer means for generating measurement signals to device under test;

prescaler amplifier means for receiving signals from said device under test and being under control of said digital computer means;

analog to digital converter means receiving signals from said prescaler amplifier means and under control of said digital computer means;

signal amplitude standardizer means receiving signals from said analog to digital converter means and being under control of said digital computer means;

detector means receiving signals from said signal amplitude standardizer means;

comparator means receiving signals from said detector means and for providing level-crossing output signals;

clock-driven counter means under control of said digital computer means;

latch means receiving signals from said counter means and said comparator means and for supplying signals to said digital computer means; and readout and control means for sending and receiving signals from said digital computer means for providing output information.

2. Automatic transient response analyzer system according to claim 1 wherein said comparator means includes positive and negative comparator means and logic gate means.

3. Automatic transient response analyzer system according to claim 1 wherein said counter means is a BCD counter means.

4. Automatic transient response analyzer system according to claim 1 wherein said clock-driven counter means includes a crystal-controlled clock means.

5. Automatic transient response analyzer system according to claim 1 wherein said signal generator means generates substantially sinusoidal signals to device under test.

* * * * *